(12) United States Patent
Sochoux et al.

(10) Patent No.: US 11,129,302 B1
(45) Date of Patent: Sep. 21, 2021

(54) APPARATUS, SYSTEM, AND METHOD FOR ELECTROMAGNETIC INTERFERENCE MITIGATION IN SPLIT HEATSINK TECHNOLOGIES

(71) Applicant: Juniper Networks, Inc., Sunnyvale, CA (US)

(72) Inventors: Philippe C. Sochoux, Sunnyvale, CA (US); Keith Hocker, Sunnyvale, CA (US); Jing Li, Sunnyvale, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 39 days.

(21) Appl. No.: 16/588,492

(22) Filed: Sep. 30, 2019

(51) Int. Cl.
| | |
|---|---|
| *H05K 7/20* | (2006.01) |
| *H05K 9/00* | (2006.01) |
| *H01L 23/427* | (2006.01) |
| *H01L 23/552* | (2006.01) |
| *H01L 23/367* | (2006.01) |
| *H01L 25/18* | (2006.01) |

(52) U.S. Cl.
CPC ..... *H05K 7/20509* (2013.01); *H01L 23/3672* (2013.01); *H01L 23/427* (2013.01); *H01L 23/552* (2013.01); *H05K 7/20518* (2013.01); *H05K 9/00* (2013.01); *H01L 25/18* (2013.01); *H05K 7/20336* (2013.01); *H05K 7/20409* (2013.01)

(58) Field of Classification Search
CPC .. H05K 7/20509; H05K 7/20518; H05K 9/00; H05K 7/20336; H05K 7/20409; H01L 23/3672; H01L 23/427; H01L 23/552; H01L 25/18
See application file for complete search history.

(56) References Cited

U.S. PATENT DOCUMENTS

| | | | |
|---|---|---|---|
| 10,304,755 B1* | 5/2019 | Yatskov | H01L 23/4006 |
| 2004/0132331 A1* | 7/2004 | Osborn | H01L 23/4006 439/485 |
| 2008/0068805 A1* | 3/2008 | Xu | H05K 7/20509 361/710 |
| 2009/0154102 A1* | 6/2009 | Zhou | H01L 23/427 361/700 |
| 2018/0286844 A1* | 10/2018 | Dogruoz | H01L 23/36 |
| 2020/0174534 A1* | 6/2020 | Ganta Papa Rao Bala | H05K 7/20418 |

* cited by examiner

*Primary Examiner* — Fernando L Toledo
*Assistant Examiner* — Neil R Prasad
(74) *Attorney, Agent, or Firm* — FisherBroyles, LLP (57) ABSTRACT

The disclosed apparatus may include (1) a split heatsink assembly that comprises (A) a first heatsink that includes a base for thermally coupling to a first heat-emitting component, wherein the base of the first heatsink forms an opening, and (B) a second heatsink that includes a pedestal for thermally coupling to a second heat-emitting component, wherein the pedestal of the second heatsink fits into the opening formed by the base of the first heatsink, and (2) an EMI absorber that at least partially encompasses the pedestal of the second heatsink and resides between the pedestal of the second heatsink and the base of the first heatsink in the opening. Various other apparatuses, systems, and methods are also disclosed.

18 Claims, 11 Drawing Sheets

APPARATUS, SYSTEM, AND METHOD FOR ELECTROMAGNETIC INTERFERENCE MITIGATION IN SPLIT HEATSINK TECHNOLOGIES

Heatsinks are often a critical component of electronic and mechanical devices. For example, a telecommunications device may include an integrated circuit that generates heat during operation, thereby causing the operating temperature of the integrated circuit to rise. If the operating temperature rises above a certain level, the integrated circuit may overheat, malfunction, or even break. To prevent such issues, many devices may be equipped with heatsinks designed to transfer and/or dissipate heat. These heatsinks may include thermally conductive material that transfers heat away from the devices, thereby cooling the devices and/or enabling them to achieve higher performance.

The operating temperature of a device often correlates to the amount of power dissipated by that device. As technological advancements increase the amount of power certain devices (such as application-specific integrated circuits and/or high-bandwidth memory devices) are able to dissipate, such devices may need and/or call for more efficient and/or effective heatsinks. This problem may be exacerbated and/or compounded in devices that contain multiple components. For example, a multichip module that contains two distinct integrated circuits may generate more heat than a simpler device containing a single integrated circuit.

Moreover, the different circuits on a multichip module may have different cooling needs. For example, a multichip module may contain both an Application-Specific Integrated Circuit (ASIC) and a High-Bandwidth Memory (HBM) device. In this example, the HBM device may be designed to operate at a lower temperature than the ASIC. Traditional heatsink technologies may attempt to lower the operating temperature of both components to the temperature required by the HBM device. Unfortunately, such attempts may be difficult, expensive, and/or simply unsuccessful. For example, a heatsink capable of cooling one device component to a temperature far below its typical operating temperature may necessitate a prohibitively large amount of space and/or cost.

However, a recent development in heatsink technology may involve combining and/or applying multiple heatsinks to a multichip module. Such heatsink technology may incorporate multiple heatsinks into a single heat-dissipating mechanism that independently and/or individually cools separate components of the multichip module, thereby enabling the components to operate at different temperatures. This mechanism may be referred to as a split heatsink.

Unfortunately, this split heatsink technology may still have a couple deficiencies capable of negatively impacting the performance of the separate components of the multichip module and/or other nearby devices. For example, a split heatsink may form and/or include gaps that enable electromagnetic radiation to enter and/or escape the corresponding multichip module. Additionally or alternatively, a split heatsink may be unable to sufficiently compensate for manufacturing tolerance variation and/or warpage of the multichip module, thereby potentially leading to misalignment of the multiple heatsinks and/or unexpected thermal bridges.

The instant disclosure, therefore, identifies and addresses a need for additional and improved apparatuses, systems, and methods for Electromagnetic Interference (EMI) mitigation in split heatsink technologies.

SUMMARY

As will be described in greater detail below, the instant disclosure generally relates to apparatuses, systems, and methods for EMI mitigation in split heatsink technologies. In one example, an apparatus for accomplishing such a task may include (1) a split heatsink assembly that comprises (A) a first heatsink that includes a base for thermally coupling to a first heat-emitting component, wherein the base of the first heatsink forms an opening, and (B) a second heatsink that includes a pedestal for thermally coupling to a second heat-emitting component, wherein the pedestal of the second heatsink fits into the opening formed by the base of the first heatsink, and (2) an EMI absorber that at least partially encompasses the pedestal of the second heatsink and resides between the pedestal of the second heatsink and the base of the first heatsink in the opening.

Similarly, a system for accomplishing such a task may include (1) a circuit board that includes a first heat-emitting component and a second heat-emitting component, (2) a split heatsink assembly coupled to the circuit board, wherein the split heatsink assembly comprises (A) a first heatsink that includes a base for thermally coupling to a first heat-emitting component, wherein the base of the first heatsink forms an opening, and (B) a second heatsink that includes a pedestal for thermally coupling to a second heat-emitting component, wherein the pedestal of the second heatsink fits into the opening formed by the base of the first heatsink, and (3) an EMI absorber that at least partially encompasses the pedestal of the second heatsink and resides between the pedestal of the second heatsink and the base of the first heatsink in the opening.

A corresponding method may include (1) coupling a split heatsink assembly to a circuit board that includes a first heat-emitting component and a second heat-emitting component such that (A) a first heatsink of the split heatsink assembly is thermally coupled to the first heat-emitting component and (B) a second heatsink of the split heatsink assembly is thermally coupled to the second heat-emitting component via an opening formed by a base of the first heatsink and (2) installing an EMI absorber that at least partially encompasses a pedestal of the second heatsink and resides between the pedestal of the second heatsink and the base of the first heatsink in the opening.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown byway of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for EMI mitigation in split heatsink technologies. As will be explained in greater detail below, the apparatuses, systems, and methods described herein may provide various advantages and/or benefits over traditional split heatsink technologies. For example, individual heatsink pieces within a split heatsink assembly may be separated from each other by a certain distance, gap, and/or clearance to prevent and/or minimize thermal crosstalk and/or bridging. Such distance, gap, and/or clearance may enable different components on a multichip module to operate at different temperatures. In this example, embodiments of the instant disclosure may be able to mitigate EMI generated by those components on the multichip module from escaping and/or penetrating through the gap and/or seam between the individual heatsink pieces.

The following will provide, with reference to FIG. 1-10, detailed descriptions of an exemplary apparatuses, systems, configurations, and/or implementations for EMI mitigation in split heatsink technologies. In addition, the discussion corresponding to FIG. 11 will provide a detailed description of an exemplary method for EMI mitigation in split heatsink technologies.

Figure 1:
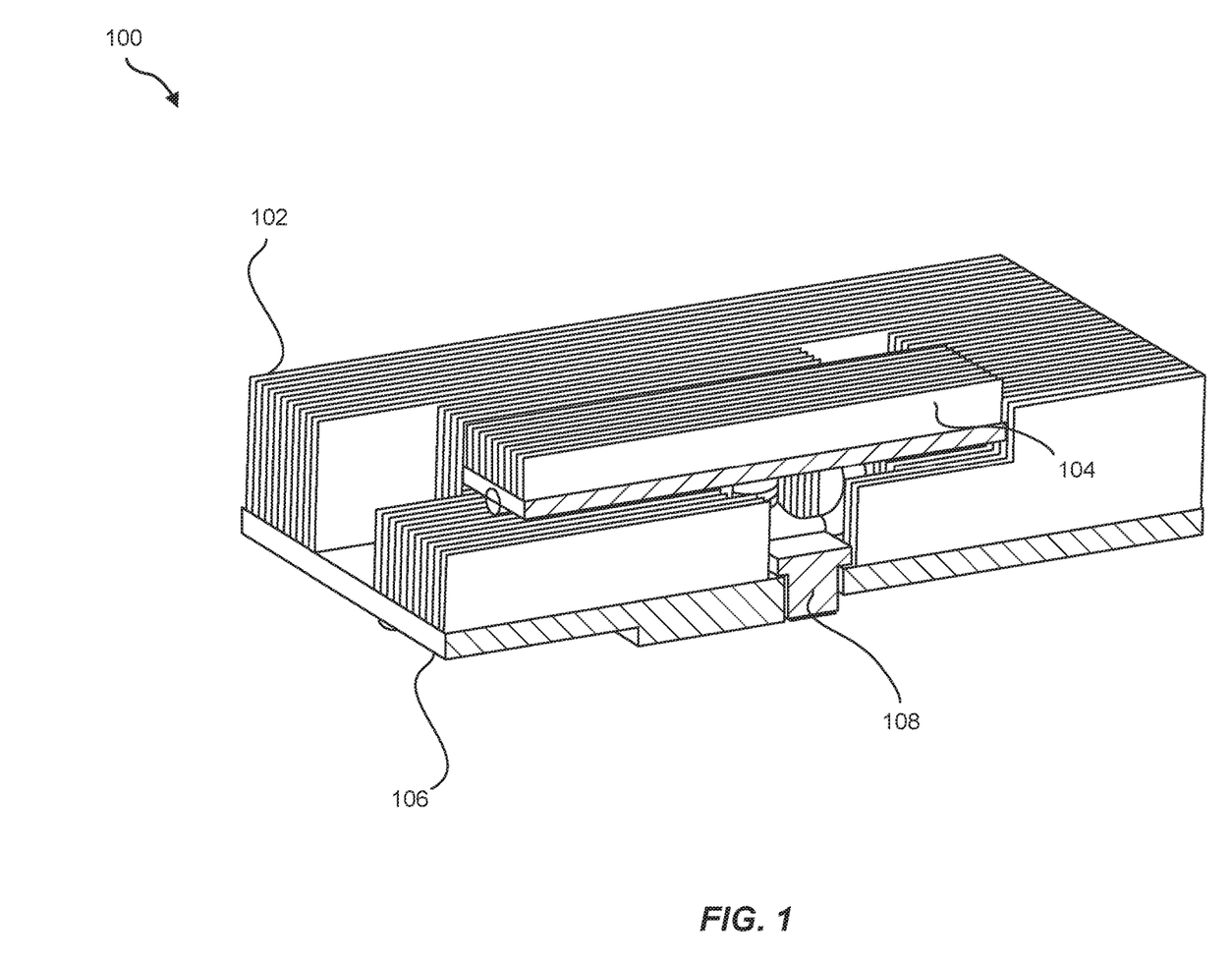
FIG. 1 is an illustration of an exemplary split heatsink assembly.
Figure 2:
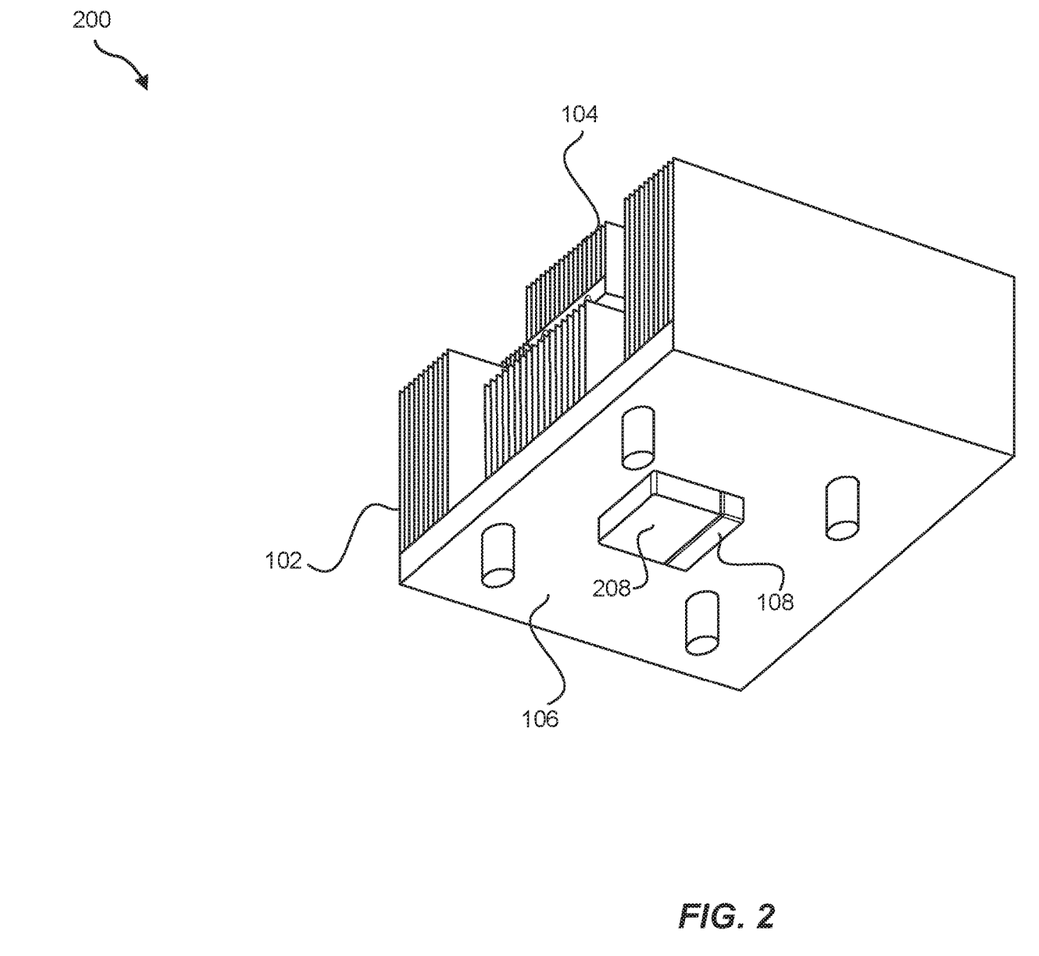
FIG. 2 is an illustration of an additional exemplary split heatsink assembly.
Figure 3:
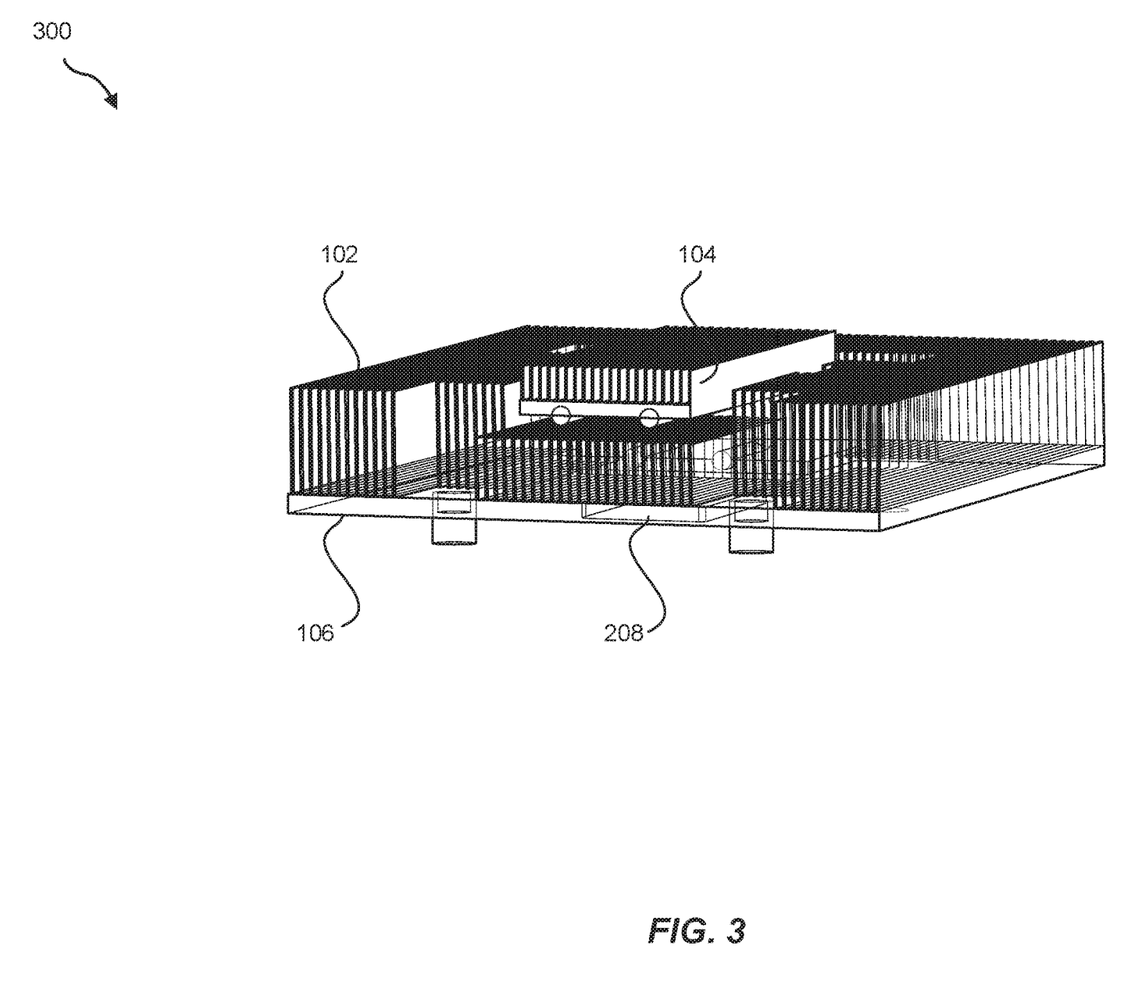
FIG. 3 is an illustration of an additional exemplary split heatsink assembly.

FIGS. 1-3 illustrate different views of exemplary split heatsink assemblies. FIG. 1 illustrates a cross section of an exemplary split heatsink assembly 100 that includes a heatsink 102 and a heatsink 104. In one example, heatsink 102 may include and/or represent a base 106 for thermally coupling to a heat-emitting component. In this example, base 106 of heatsink 102 may include and/or incorporate a pedestal for making physical contact and/or interfacing with the heat-emitting component. Base 106 of heatsink 102 may form and/or incorporate an opening, hole, and/or seam. This opening, hole, and/or seam may be sized and/or fitted to accept a part and/or pedestal of heatsink 104.

In one example, heatsink 104 may include and/or represent a pedestal 108 for thermally coupling to another heat-emitting component. In this example, pedestal 108 of heatsink 104 may be sized and/or fitted to be inserted and/or installed into the opening, hole, and/or seam formed by base 106 of heatsink 102. Heatsinks 102 and 104 may be thermally coupled to separate and/or distinct heat-emitting components (not illustrated in FIG. 1).

Heatsinks 102 and 104 each generally represent any type or form of device, structure, and/or mechanism designed to conduct, transfer, absorb, and/or sink heat. Heatsinks 102 and 104 may include and/or contain a variety of thermally conductive materials. Examples of such thermally conductive materials include, without limitation, copper, aluminum, diamond, alloys of one or more of the same, combinations or variations of one or more of the same, and/or any other suitable materials.

In some examples, heatsinks 102 and 104 may contain and/or be composed of a series of ridges or corrugations extending from a base. For example, heatsinks 102 and 104 may include and/or incorporate a finned and/or pin fin configuration or design. This configuration may increase the surface area of the conductive material within the heatsink, thereby increasing the amount of heat dissipated by the same. In other words, heatsinks 102 and 104 may each include and/or incorporate a fin structure that extends from a base. Heatsinks 102 and 104 may also include any additional or alternative structure designed to facilitate and/or increase heat dissipation, such as wicks, heatpipes, and/or vapor chambers.

FIG. 2 illustrates an exemplary split heatsink assembly 200 that includes heatsink 102 and heatsink 104. As illustrated in FIG. 2, heatsink 102 and 104 may be coupled, combined, joined, and/or united to one another, thereby forming and/or assembling split heatsink assembly 200. For example, heatsink 102 may be coupled to a circuit board (not illustrated in FIG. 2) and/or substrate that includes a multichip module. In this example, the multichip module may include and/or represent multiple heat-emitting components to which heatsinks 102 and 104 are applied and/or thermally coupled.

As illustrated in FIG. 2, heatsink 102 may include a pedestal 208 that extends from base 106. In one example, pedestal 108 of heatsink 104 may interface with one heat-emitting component, and pedestal 208 of heatsink 102 may interface with another heat-emitting component. In this example, heatsink 104 may be movably coupled and/or joined to heatsink 102 or the circuit board.

Heatsinks 102 and 104 may be movably coupled and/or joined together in a variety of different ways and/or contexts. For example, heatsink 104 may be movably coupled to heatsink 102 by a spring-loaded clamping mechanism that enables heatsink 104 to float relative to heatsink 102. By being movably coupled in this way, heatsinks 102 and 104 may be able to compensate for manufacturing tolerance variation and/or warpage of the multichip module, thereby facilitating the appropriate load balance and/or thermal-joint distribution across the components of the multichip module despite such tolerance variation and/or warpage. Accordingly, this movable coupling may decrease the risk of unexpected thermal bridges and/or contact across the individual heatsink pieces of split heatsink assembly 200.

FIG. 3 illustrates an exemplary split heatsink assembly 300 that includes heatsink 102 and heatsink 104. As illustrated in FIG. 3, heatsink 102 and 104 may be coupled, combined, joined, and/or united to one another, thereby forming and/or assembling split heatsink assembly 300. For example, heatsink 102 may be coupled to a circuit board (not illustrated in FIG. 3) and/or substrate that includes a multichip module. In this example, the multichip module may include and/or represent multiple heat-emitting components to which heatsinks 102 and 104 are applied and/or thermally coupled.

Figure 4:
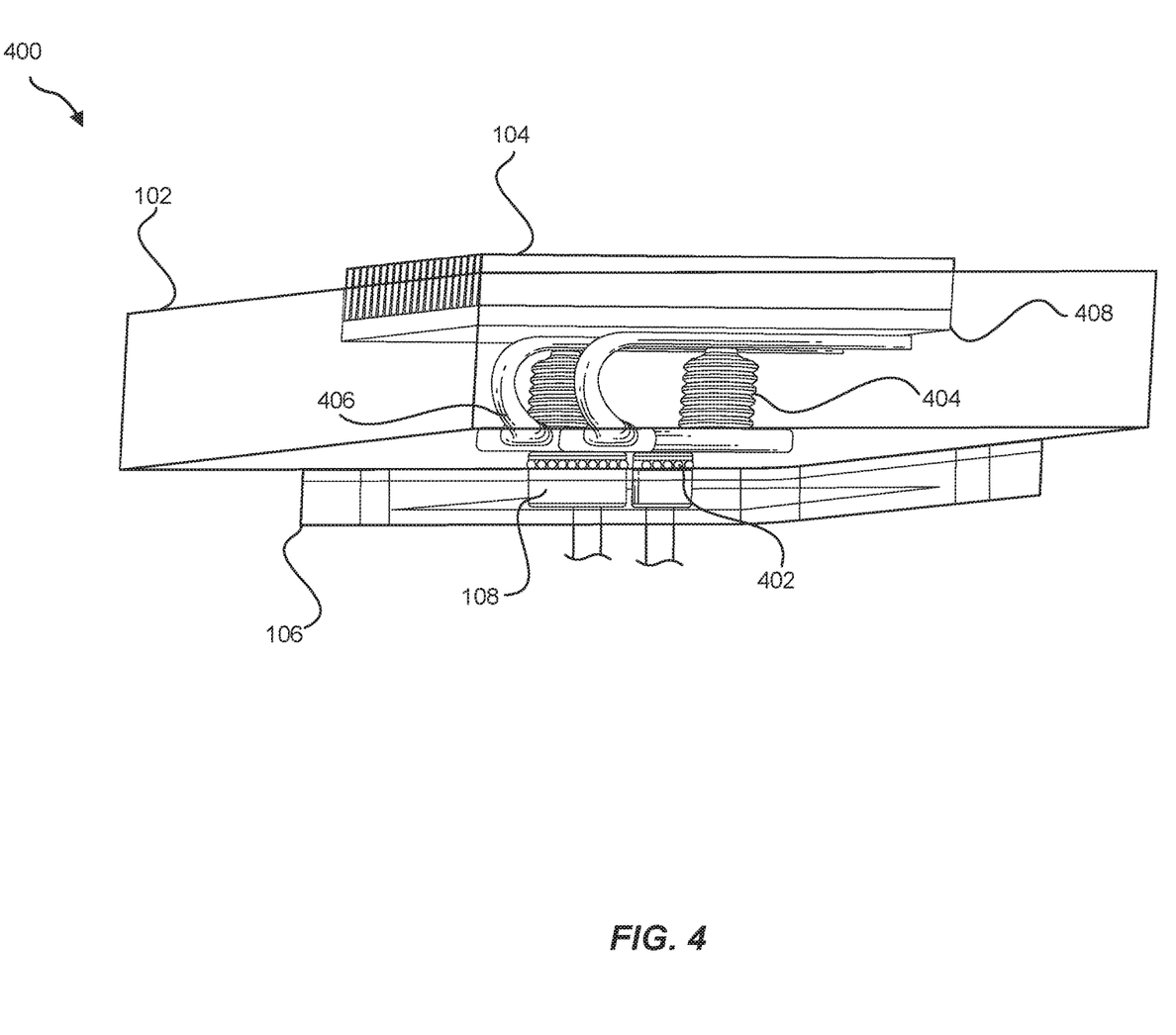
FIG. 4 is an illustration of an exemplary configuration of an apparatus for EMI mitigation in split heatsink technologies.

FIG. 4 illustrates an exemplary apparatus 400 that includes split heatsink assembly 100 and an EMI absorber 402. As illustrated in FIG. 4, split heatsink assembly 100 may include and/or represent heatsink 102 and 104 coupled, combined, joined, and/or united to one another by way of spring-loaded clamping mechanism 404. In one example, EMI absorber 402 may at least partially encompass, encircle, and/or surround pedestal 108 of heatsink 104. In this example, when pedestal 108 of heatsink 104 is inserted and/or installed into the opening formed by heatsink 102, EMI absorber 402 may reside and/or sit between pedestal 108 of heatsink 104 and base 106 of heatsink 102.

In some examples, EMI absorber 402 may include and/or represent a mechanical seal and/or filler that fills space at a junction between mating surfaces. In one example, EMI absorber 402 may be designed to reduce EMI and/or electromagnetic noise in connection with the operation of a multichip module. In other words, EMI absorber 402 may include and/or represent a form of electromagnetic shielding applied between pedestal 108 of heatsink 104 and base 106 of heatsink 102. Accordingly, EMI absorber 402 may effectively form a seal between pedestal 108 of heatsink 104 and base 106 of heatsink 102, thereby preventing EMI and/or electromagnetic noise generated by components of the multichip module from escaping the and/or preventing EMI and/or electromagnetic noise generated by nearby components and/or devices from penetrating split heatsink assembly 100.

In one example, EMI absorber 402 may fill a void and/or air gap between heatsinks 102 and 104. In other words, in the absence of EMI absorber 402, a void and/or air gap may exist between the pedestals of heatsinks 102 and 104. EMI absorber 402 may increase the shielding effectiveness of split heatsink assembly 100. In doing so, EMI absorber 402 may mitigate the potential harm, interference, and/or performance degradation caused by electromagnetic noise from the multichip module and/or nearby components or devices. EMI absorber 402 may also enable the multichip module to better comply with the regulations implemented by governmental bodies to limit the amount of electromagnetic radiation that such modules are allowed to emit-even as this technology advances and/or its performance continues to improve.

In one example, EMI absorber 402 may include and/or form an opening, hole, and/or seam through which pedestal 108 of heatsink 104 makes physical contact with one component of the multichip module. For example, pedestal 108 of heatsink 104 may pass through the opening, hole, and/or seam of EMI absorber 402 to reach and make physical contact with an HBM on the multichip module. In this example, opening 108 may be sized, shaped, and/or fitted to accommodate pedestal 108 of heatsink 104.

EMI absorber 402 may be of various shapes and/or dimensions. In some examples, EMI absorber 402 may form an oval, a square, and/or a rectangle. Additional examples of shapes formed by EMI absorber 402 include, without limitation, circles, triangles, diamonds, parallelograms, variations or combinations of one or more of the same, and/or any other suitable shapes.

EMI absorber 402 may include and/or contain a variety of materials. In one example, EMI absorber 402 may be composed of one or more elastomers. Additional examples of materials include, without limitation, rubbers, papers, plastics, silicones, metals, corks, neoprenes, fiberglasses, polytetrafluorethylenes, polymers, combinations or variations of one or more of the same, and/or any other suitable materials.

In one example, EMI absorber 402 may include and/or represent a silicone-based absorber. In another example, EMI absorber 402 may include and/or represent a fabric-over-foam gasket. In a further example, EMI absorber 402 may include and/or represent a conductive gasket. In an additional example, EMI absorber 402 may include and/or represent a finger stock gasket.

EMI absorber 402 may have and/or exhibit various qualities and/or properties conducive to EMI mitigation. As a specific example, EMI absorber 402 may have a frequency range of greater than or equal to 6 gigahertz, a maximum service temperature of 170 degrees Celsius, a Shore hardness of greater than 70, an elongation of 50%, a tensile strength of 5.0 megapascals, a volume resistivity of $2 \times 10^8$ ohms per centimeter, and/or a dielectric strength of greater than 10 volts per mil.

In some examples, EMI absorber 402 may contribute to reducing an amount of radiated energy that escapes and/or penetrates through the opening(s) and/or seam(s) between heatsinks 102 and 104. For example, EMI absorber 402 may convert at least a portion of the radiated energy produced by the components of the multichip module to heat. Additionally or alternatively, EMI absorber 402 may conduct at least a portion of the radiated energy produced by the components of the multichip module. In one example, EMI absorber 402 may contribute to limiting the amount of radiated energy that escapes via the opening(s) and/or seam(s) to less than −15 decibels relative to the governmental class A regulatory limit.

As illustrated in FIG. 4, heatsink 104 may include and/or contain a floating heatsink extension 408 and/or a heatpipe 406. In one example, heatpipe 406 may be coupled to and/or between pedestal 108 and floating heatsink extension 408. In this example, heatpipe 406 may support floating heatsink extension 408 and/or provide additional heat exchange, transfer, and/or dispersion capabilities for heatsink 104. Additionally or alternatively, floating heatsink extension 408 may extend and/or expand the conductive surface area of heatsink 104, thereby providing additional heat exchange, transfer, and/or dispersion capabilities for heatsink 104.

Figure 5:
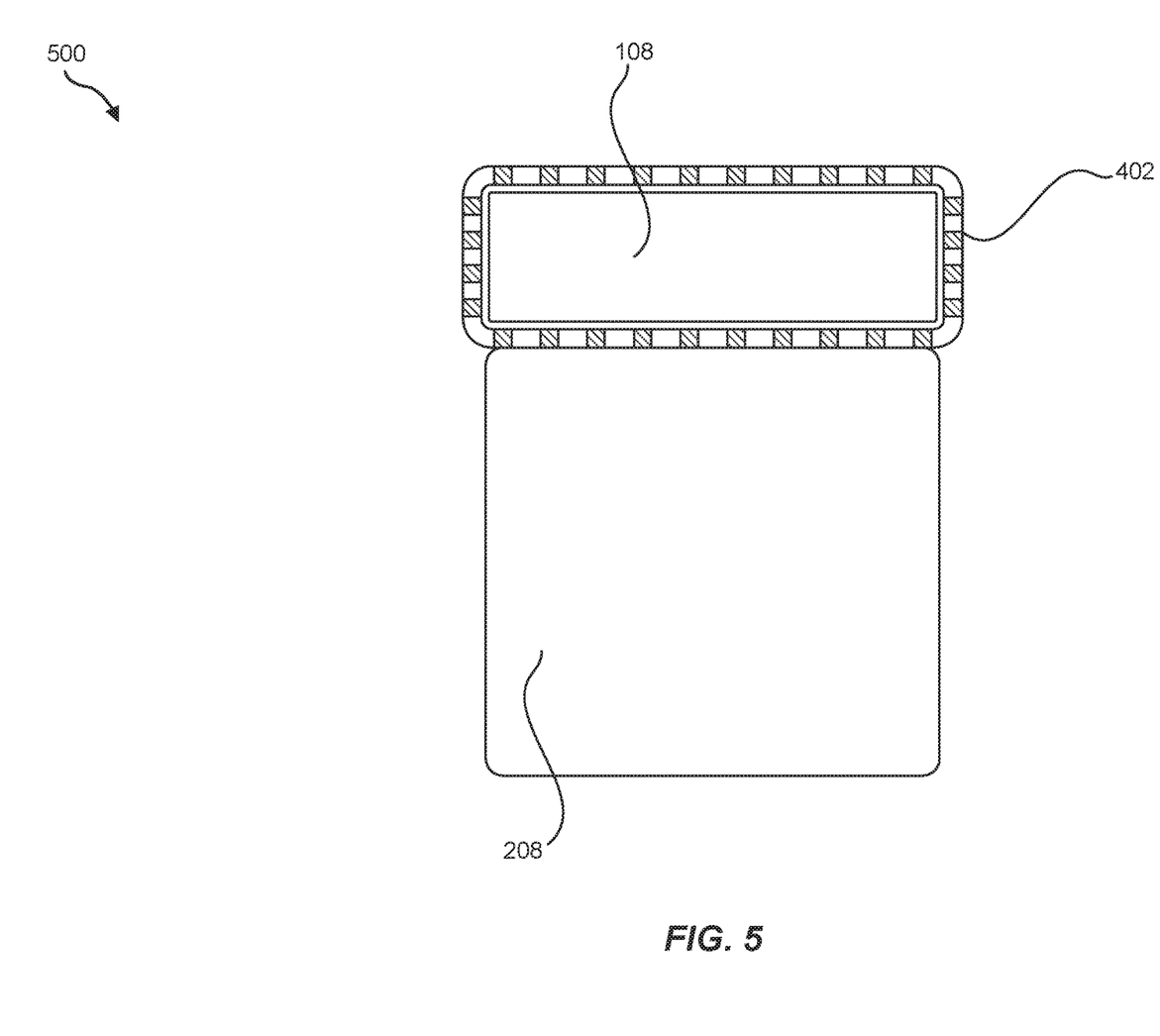
FIG. 5 is an illustration of an exemplary system or apparatus for EMI mitigation in split heatsink technologies.

FIG. 5 illustrates a top-down view of an exemplary apparatus 500 that includes split heatsink assembly 100 and an EMI absorber 402. In one example, split heatsink assembly 100 may include and/or represent heatsink 102 and 104 whose pedestals 208 and 108, respectively, are aligned with one another but separated by EMI absorber 402. As illustrated in FIG. 5, EMI absorber 402 may fill the gap and/or seam between pedestals 208 and 108.

Figure 6:
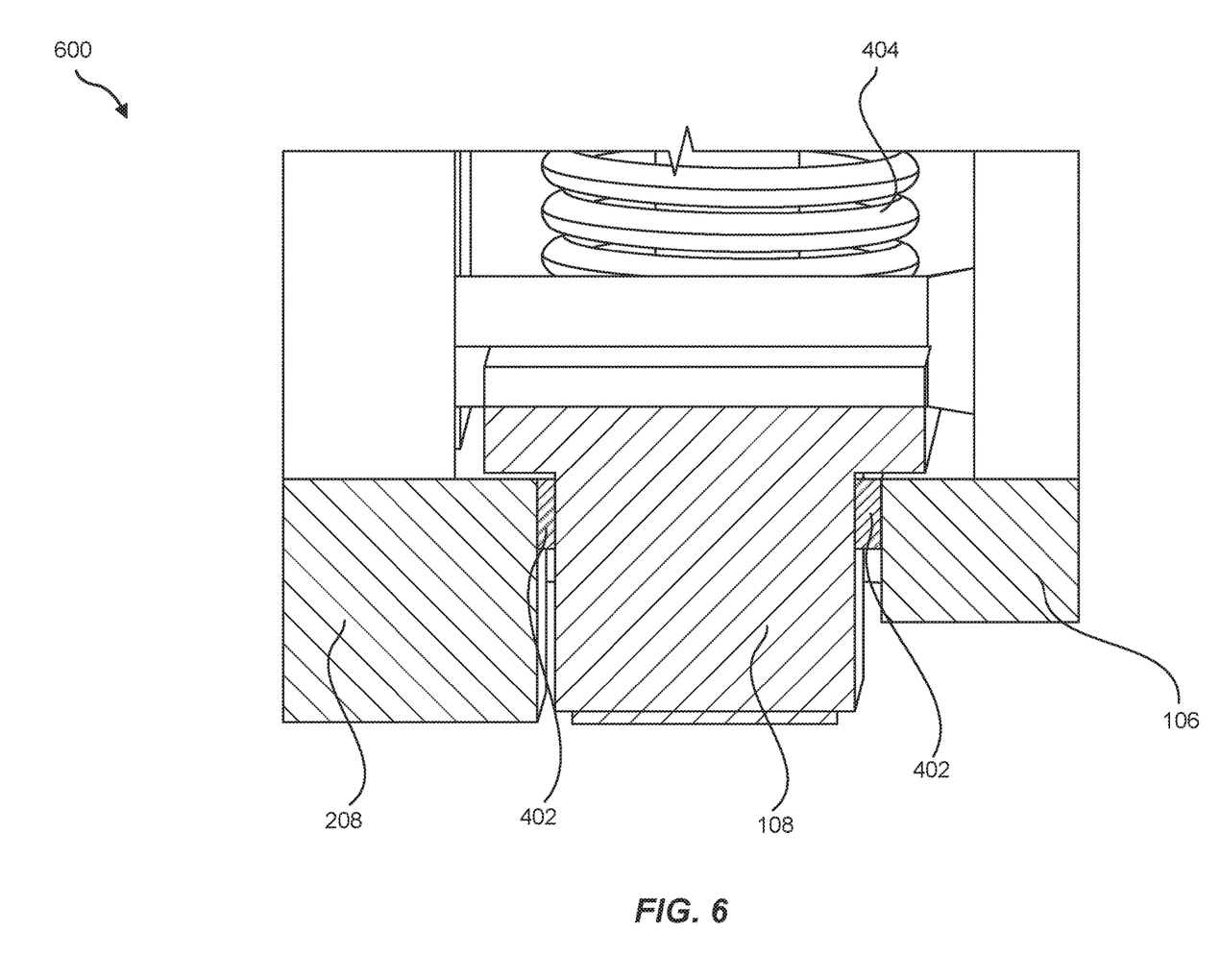
FIG. 6 is an illustration of an exemplary system or apparatus for EMI mitigation in split heatsink technologies.
Figure 7:
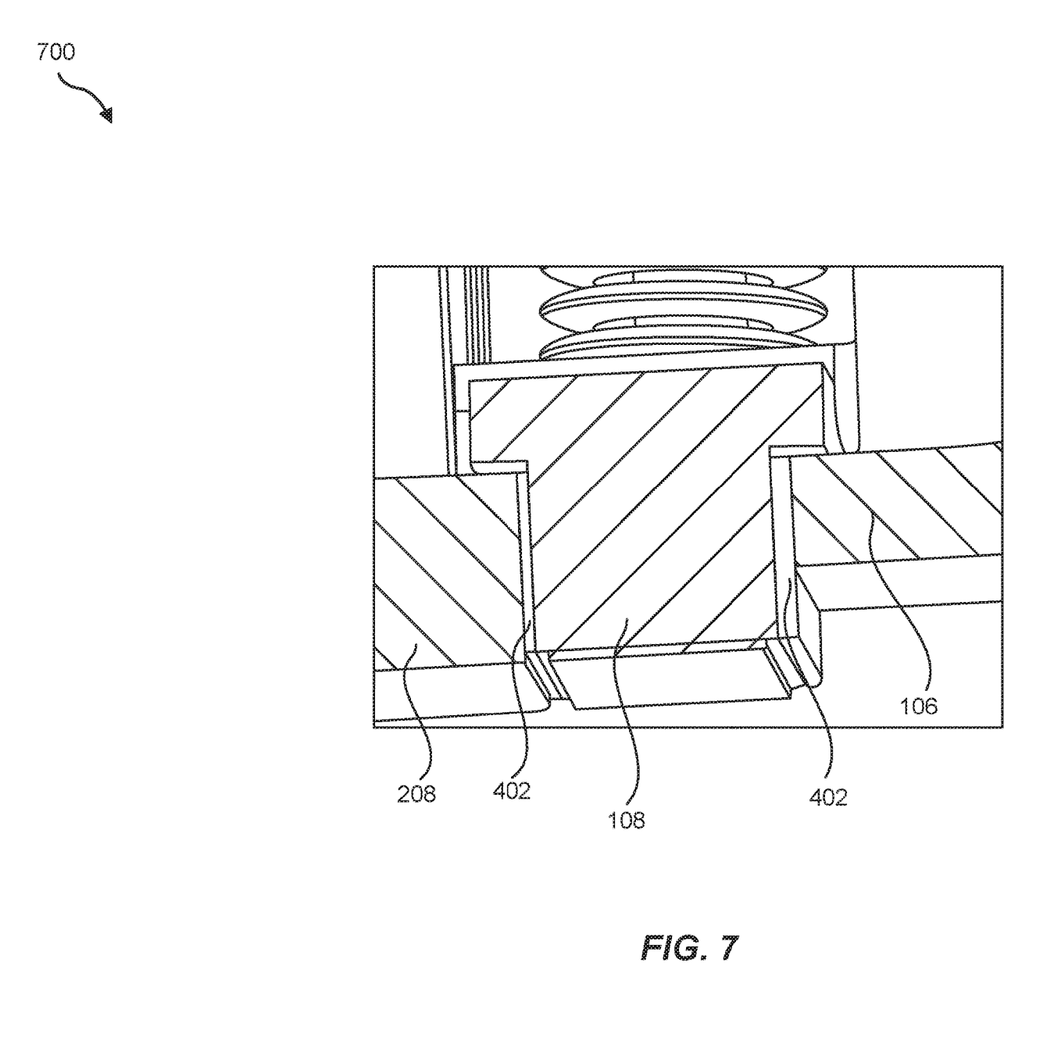
FIG. 7 is an illustration of an additional exemplary system or apparatus for EMI mitigation in split heatsink technologies.

FIGS. 6 and 7 illustrate close-up views of exemplary apparatuses 600 and 700, respectively, that include split heatsink assembly 100 and an EMI absorber 402. In one example, split heatsink assembly 100 may include and/or represent heatsink 102 and 104 whose pedestals 208 and 108, respectively, are aligned with one another but separated by EMI absorber 402. As illustrated in FIGS. 6 and 7, EMI absorber 402 may fill the gap and/or seam between pedestals 208 and 108. Additionally or alternatively, EMI absorber 402 may fill the gap and/or seam between pedestal 108 of heatsink 104 and base 106 of heatsink 102.

Figure 8:
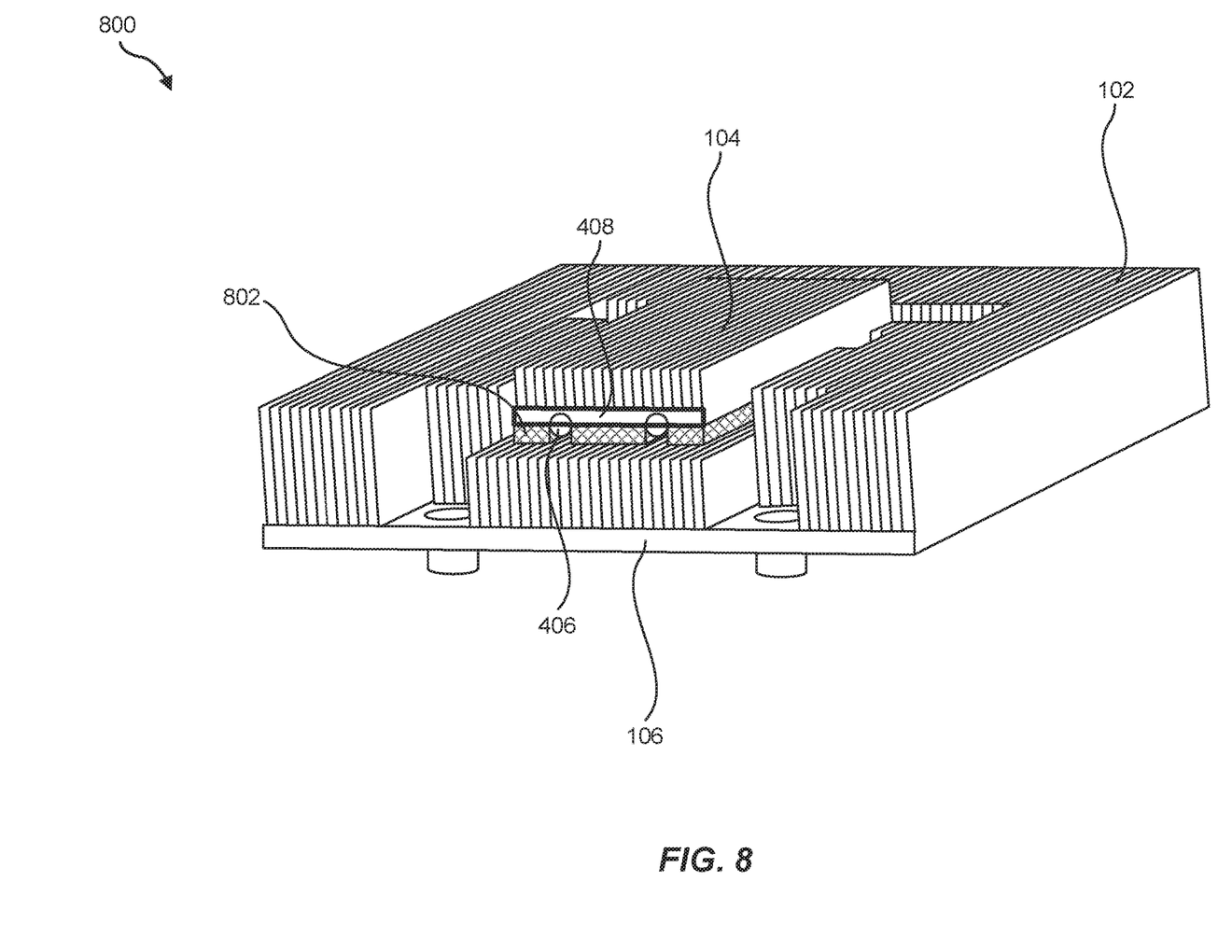
FIG. 8 is an illustration of an additional exemplary system or apparatus for EMI mitigation in split heatsink technologies.

FIG. 8 illustrates an apparatus 800 that includes split heatsink assembly 100, EMI absorber 402, and EMI absorber 802. As illustrated in FIG. 8, EMI absorber 802 may be coupled between floating heatsink extension 408 of heatsink 104 and the fin structure of heatsink 102. Accordingly, EMI absorber 802 may reside and/or sit between floating heatsink extension 408 of heatsink 104 and the fin structure of heatsink 102. Additionally or alternatively, EMI absorber 802 may reside and/or sit between floating heatsink extension 408 of heatsink 104 and base 106 of heatsink 102. EMI absorber 802 in FIG. 8 may have any of the same attributes and/or characteristics as EMI absorber 402 in FIG. 4.

In some examples, EMI absorber 802 may contribute to reducing an amount of radiated energy that escapes and/or penetrates through the opening(s) and/or seam(s) between heatsinks 102 and 104. For example, EMI absorber 802 may convert at least a portion of the radiated energy produced by the components of the multichip module to heat. Additionally or alternatively, EMI absorber 802 may conduct at least a portion of the radiated energy produced by the components of the multichip module. In one example, EMI absorber 802 may contribute to limiting the amount of radiated energy that escapes via the opening(s) and/or seam(s) to less than −15 decibels relative to the class A regulatory limit.

Figure 9:
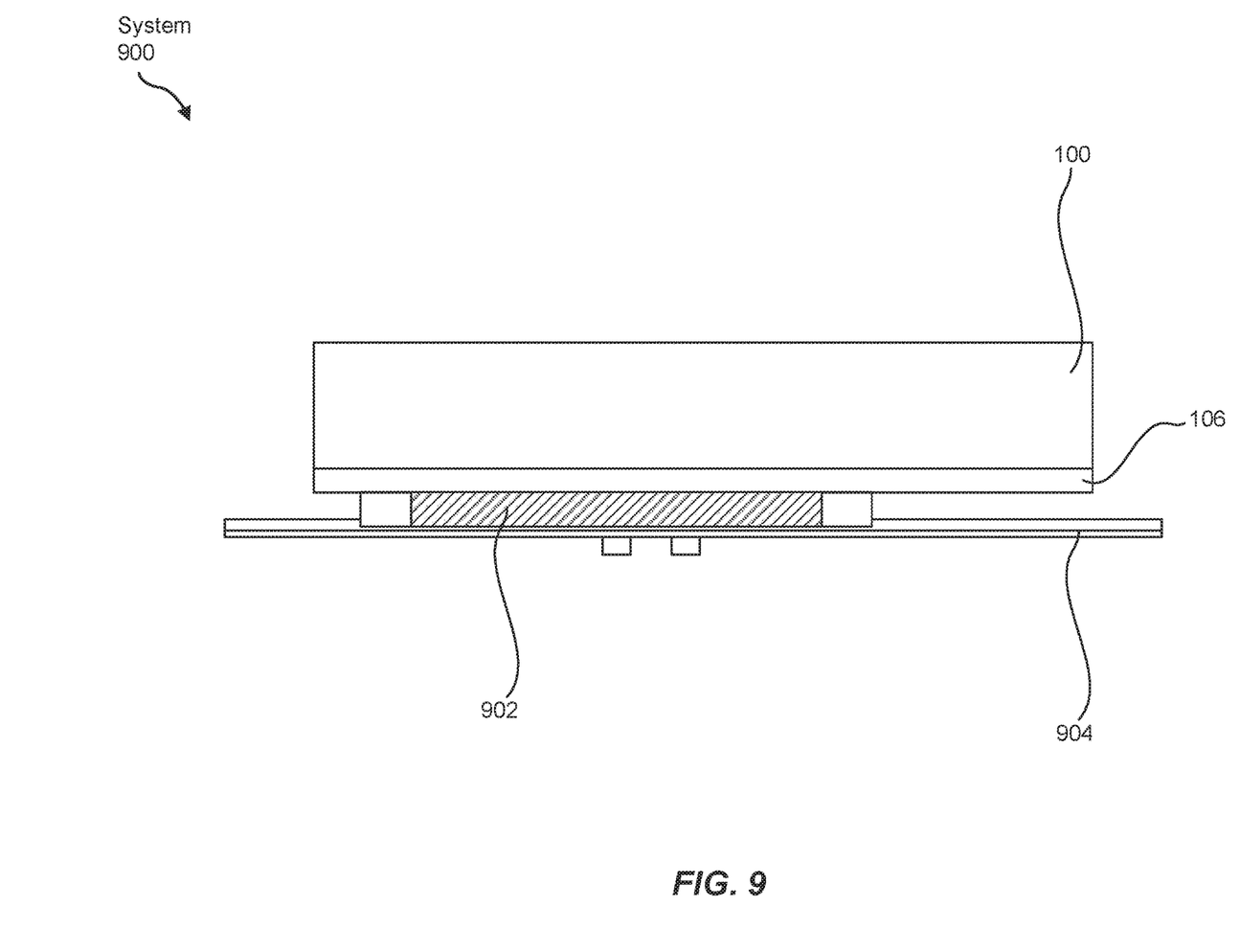
FIG. 9 is an illustration of an additional exemplary system or apparatus for EMI mitigation in split heatsink technologies.

FIG. 9 illustrates an apparatus 900 that includes split heatsink assembly 100, EMI absorber 902, EMI absorber 802 (not visible in FIG. 9), and/or EMI absorber 402 (not visible in FIG. 9). As illustrated in FIG. 9, EMI absorber 902 may at least partially encompass, encircle, and/or surround the heat-emitting components of the multichip module. In one example, EMI absorber 902 may reside and/or sit between base 106 of heatsink 102 and a circuit board 904 that includes the heat-emitting components. In this example, circuit board 904 may include and/or represent a substrate to which the heat-emitting components of the multichip module are coupled and/or secured. EMI absorber 902 in FIG. 9 may have any of the same attributes and/or characteristics as EMI absorber 402 in FIG. 4 and/or EMI absorber 802 in FIG. 8.

In some examples, EMI absorber 902 may contribute to reducing an amount of radiated energy that escapes through the opening(s) and/or seam(s) between heatsink 102 and circuit board 904. For example, EMI absorber 902 may convert at least a portion of the radiated energy produced by the components of the multichip module to heat. Additionally or alternatively, EMI absorber 902 may conduct at least a portion of the radiated energy produced by the components of the multichip module. In one example, EMI absorber 902 may contribute to limiting the amount of radiated energy that escapes via the opening(s) and/or seam(s) to less than −15 decibels relative to the class A regulatory limit.

Figure 10:
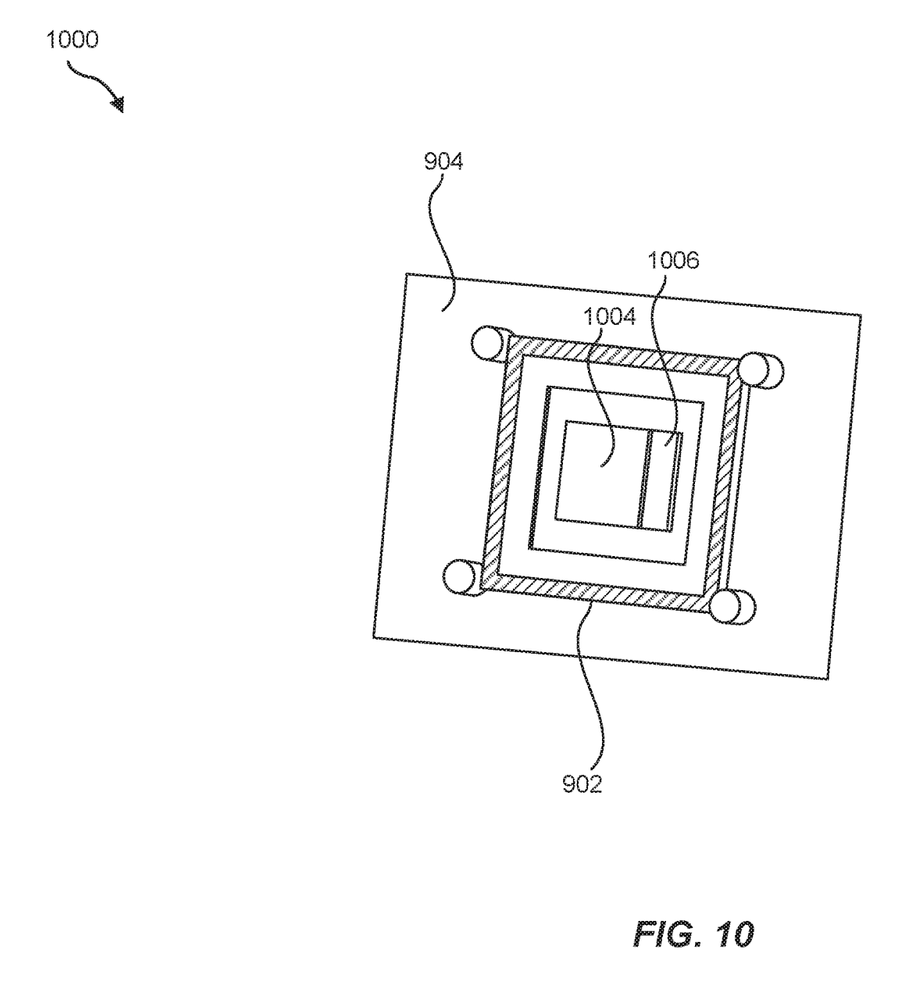
FIG. 10 is an illustration of an additional exemplary system or apparatus for EMI mitigation in split heatsink technologies.

FIG. 10 illustrates a multichip module 1000 and EMI absorber 902. As illustrated in FIG. 10, multichip module 1000 may include and/or incorporate heat-emitting components 1004 and 1006. In one example, heat-emitting component 1004 may include and/or represent an ASIC, and heat-emitting component 1006 may include and/or represent an HBM device. In this example, EMI absorber 902 may at least partially encompass, encircle, and/or surround heat-emitting components 1004 and 1006 of multichip module 1000. Accordingly, EMI absorber 902 may reside and/or sit between base 106 of heatsink 102 (not illustrated in FIG. 10) and a circuit board 904 that includes heat-emitting components 1004 and 1006.

Figure 11:
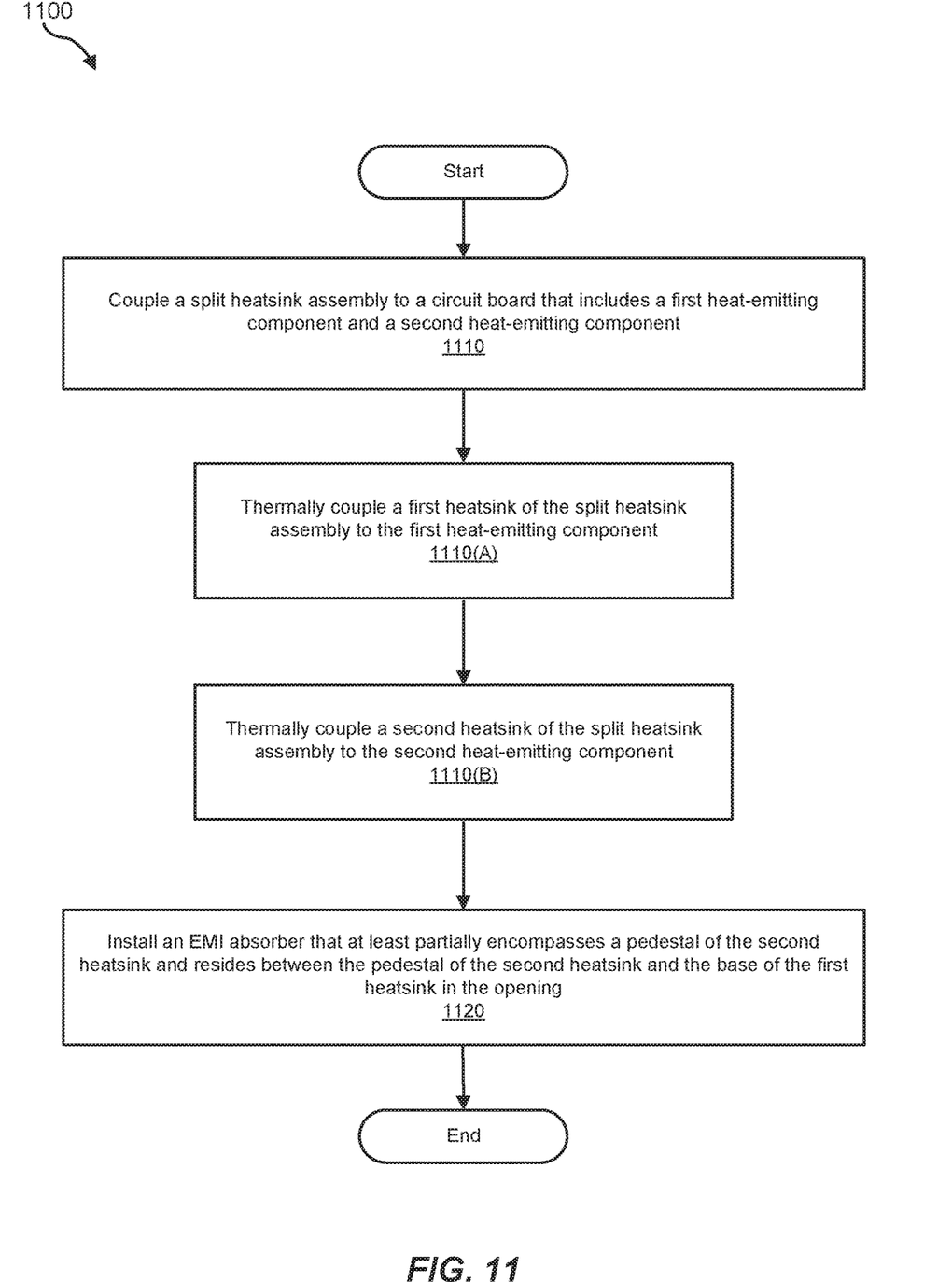
FIG. 11 is a flow diagram of an exemplary method for EMI mitigation in split heatsink technologies.

FIG. 11 is a flow diagram of an exemplary method 1100 for EMI mitigation in split heatsink technologies. Method 1100 may include the step of coupling a split heatsink assembly to a circuit board that includes a first heat-emitting component and a second heat-emitting component (1110). Step 1110 may be performed in a variety of ways, including any of those described above in connection with FIGS. 1-10. For example, a computing equipment manufacturer or subcontractor may couple a split heatsink assembly to a circuit board that includes a first heat-emitting component and a second heat-emitting component. In doing so, the computing equipment manufacturer or subcontractor may thermally couple a first heatsink of the split heatsink assembly to the first heat-emitting component (1110(A)) and/or thermally coupling a second heatsink of the split heatsink assembly to the second heat-emitting component (1110(B)).

Method 1100 may also include the step of installing an EMI absorber that at least partially encompasses a pedestal of the second heatsink and resides between the pedestal of the second heatsink and the base of the first heatsink in the opening (1120). Step 1120 may be performed in a variety of ways, including any of those described above in connection with FIGS. 1-10. For example, the computing equipment manufacturer or subcontractor may install, insert, and/or apply the EMI absorber that at least partially encompasses a pedestal of the second heatsink and resides between the pedestal of the second heatsink and the base of the first heatsink in the opening.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
   a split heatsink assembly that comprises:
      a first heatsink that includes a base for thermally coupling to a first heat-emitting component, wherein the base of the first heatsink forms an opening; and
      a second heatsink that includes a pedestal for thermally coupling to a second heat-emitting component, wherein:
         the pedestal of the second heatsink fits into the opening formed by the base of the first heatsink; and
         the first heatsink and the second heatsink are thermally isolated from one another by a gap between the pedestal of the second heatsink and the base of the first heatsink; and
   an Electromagnetic Interference (EMI) absorber that:
      at least partially encompasses the pedestal of the second heatsink;
      resides within the gap between the pedestal of the second heatsink and the base of the first heatsink; and
      contributes to reducing an amount of radiated energy that escapes from the first heat-emitting component and the second heat-emitting component via the gap.

2. The apparatus of claim 1, wherein the EMI absorber comprises at least one of:
   a silicone-based absorber;
   a fabric-over-foam gasket;
   a conductive gasket; and
   a finger stock gasket.

3. The apparatus of claim 1, wherein:
   the first heatsink is coupled to a circuit board that includes the first heat-emitting component and the second heat-emitting component; and
   the second heatsink is movably coupled to the first heatsink or the circuit board by a spring-loaded clamping mechanism that enables the second heatsink to float relative to the first heatsink.

4. The apparatus of claim 1, wherein the second heatsink comprises:
   a floating heatsink extension; and
   at least one heatpipe coupled to the pedestal and the floating heatsink extension.

5. The apparatus of claim 4, further comprising an additional EMI absorber that resides between the floating heatsink extension of the second heatsink and the base of the first heatsink.

6. The apparatus of claim 5, wherein:
   the first heatsink comprises a fin structure that extends from the base; and
   the additional EMI absorber is coupled between the floating heatsink extension of the second heatsink and the fin structure of the first heatsink.

7. The apparatus of claim 1, wherein:
   the first heat-emitting component comprises an Application Specific Integrated Circuit (ASIC); and
   the second heat-emitting component comprises a High Bandwidth Memory (HBM) device.

8. The apparatus of claim 1, further comprising an additional EMI absorber that:
   at least partially encompasses the first heat-emitting component and the second heat-emitting component; and
   resides between the base of the first heatsink and a circuit board that includes the first heat-emitting component and the second heat-emitting component.

9. The apparatus of claim 1, wherein the EMI absorber contributes to reducing the amount of radiated energy that escapes via the opening by at least one of:
   converting at least a portion of the radiated energy to heat; and
   conducting the radiated energy.

10. A system comprising:
    a circuit board that includes a first heat-emitting component and a second heat-emitting component; and
    a split heatsink assembly coupled to the circuit board, wherein the split heatsink assembly comprises:
       a first heatsink that includes a base for thermally coupling to the first heat-emitting component, wherein the base of the first heatsink forms an opening; and
       a second heatsink that includes a pedestal for thermally coupling to t second heat-emitting component, wherein;
          the pedestal of the second heatsink fits into the opening formed by the base of the first heatsink; and
          the first heatsink and the second heatsink are thermally isolated from one another by a gap between the pedestal of the second heatsink and the base of the first heatsink; and
    an Electromagnetic Interference (EMI) absorber that:
       at least partially encompasses the pedestal of the second heatsink;
       resides within the gap between the pedestal of the second heatsink and the base of the first heatsink; and
       contributes to reducing an amount of radiated energy that escapes from the first heat-emitting component and the second heat-emitting component via the gap.

11. The system of claim 10, wherein the EMI absorber comprises at least one of:
    a silicone-based absorber;
    a fabric-over-foam gasket;
    a conductive gasket; and
    a finger stock gasket.

12. The system of claim 10, wherein:
    the first heatsink is coupled to the circuit board that includes the first heat-emitting component and the second heat-emitting component; and
    the second heatsink is movably coupled to the first heatsink or the circuit board by a spring-loaded clamping mechanism that enables the second heatsink to float relative to the first heatsink.

13. The system of claim 10, wherein the second heatsink comprises:
    a floating heatsink extension; and
    at least one heatpipe coupled to the pedestal and the floating heatsink extension.

14. The system of claim 13, further comprising an additional EMI absorber that resides between the floating heatsink extension of the second heatsink and the base of the first heatsink.

15. The system of claim 14, wherein:
    the first heatsink comprises a fin structure that extends from the base; and
    the additional EMI absorber is coupled between the floating heatsink extension of the second heatsink and the fin structure of the first heatsink.

16. The system of claim 10, wherein:
    the first heat-emitting component comprises an Application Specific Integrated Circuit (ASIC); and the second heat-emitting component comprises a High Bandwidth Memory (HBM) device.

17. The system of claim 10, further comprising an additional EMI absorber that:
   at least partially encompasses the first heat-emitting component and the second heat-emitting component; and
   resides between the base of the first heatsink and the circuit board that includes the first heat-emitting component and the second heat-emitting component.

18. A method comprising:
   coupling a split heatsink assembly to a circuit board that includes a first heat-emitting component and a second heat-emitting component such that:
      a first heatsink of the split heatsink assembly is thermally coupled to the first heat-emitting component; and
      a second heatsink of the split heatsink assembly is thermally coupled to the second heat-emitting component via an opening formed by a base of the first heatsink wherein the first heatsink and the second heatsink are thermally isolated from one another by a gap between a pedestal of the second heatsink and the base of the first heatsink; and
   installing an Electromagnetic Interference (EMI) absorber that;
      at least partially encompasses t pedestal of the second heatsink;
      resides within the gap between the pedestal of the second heatsink and the base of the first heatsink; and
      contributes to reducing an amount of radiated energy that escapes from the first heat-emitting component and the second heat-emitting component via the gap.

* * * * *